United States Patent
Emrich et al.

(10) Patent No.: US 6,986,216 B2
(45) Date of Patent: Jan. 17, 2006

(54) WEAR ASSEMBLY FOR THE DIGGING EDGE OF AN EXCAVATOR

(75) Inventors: Robert K. Emrich, Tigard, OR (US); Terry L. Briscoe, Portland, OR (US)

(73) Assignee: Esco Corporation, Portland, OR (US)

( * ) Notice: Subject to any disclaimer, the term of this patent is extended or adjusted under 35 U.S.C. 154(b) by 94 days.

(21) Appl. No.: 10/425,606

(22) Filed: Apr. 30, 2003

(65) Prior Publication Data

US 2004/0216334 A1 Nov. 4, 2004

(51) Int. Cl.
*E02F 9/28* (2006.01)

(52) U.S. Cl. .............................. 37/450; 37/455; 37/454
(58) Field of Classification Search ................... 37/451, 37/450, 454, 455
See application file for complete search history.

(56) References Cited

U.S. PATENT DOCUMENTS

| | | | |
|---|---|---|---|
| 1,021,185 A | 3/1912 | Foster | |
| 1,031,138 A | 7/1912 | McKee et al. | |
| 1,076,548 A | 10/1913 | Butler | |
| 1,485,243 A | 2/1924 | Blake | |
| 1,775,984 A | 9/1930 | Younie | |
| 1,917,431 A | 7/1933 | O'Fallon | |
| 1,959,847 A | 5/1934 | Buskirk | |
| 2,020,215 A | 11/1935 | Ross | |
| 2,547,789 A | 4/1951 | Skeel | |
| 3,032,152 A | 5/1962 | Titsler | |
| 3,121,289 A | 2/1964 | Eyolfson | |
| 3,160,967 A | 12/1964 | Nichols | |
| 3,621,594 A | 11/1971 | Hahn et al. | |
| 3,685,177 A | 8/1972 | Hahn et al. | |
| 3,736,664 A | 6/1973 | Black et al. | |
| 3,841,007 A | 10/1974 | Howarth et al. | |
| 3,851,413 A | 12/1974 | Lukavich | |
| 3,864,853 A | 2/1975 | Klett et al. | |
| 3,947,982 A | 4/1976 | Mantovani | |
| 3,974,579 A | 8/1976 | Black et al. | |
| 3,995,384 A | 12/1976 | Wood | |
| 4,006,544 A | 2/1977 | Stepe | |
| D245,780 S | 9/1977 | Dahlberg et al. | |
| 4,103,442 A | 8/1978 | Zepf | |
| 4,205,469 A | 6/1980 | Johansson et al. | |
| 4,267,653 A | 5/1981 | Hahn et al. | |
| 4,326,348 A | 4/1982 | Emrich | |
| 4,372,703 A | 2/1983 | Szostak | |
| 4,380,102 A | 4/1983 | Hansson | |

(Continued)

FOREIGN PATENT DOCUMENTS

WO  PCT WO 02/12642  2/2002

OTHER PUBLICATIONS

ESCO Brochure; "Instructions for T4–V71, & T4R–V&1 Toplok® Adapters", M/LMS–504–0302, 2002, pp. 1–8.
ESCO Booklet; "ESCO Toplok Adapter System For Plate Lips", Mining College '97, DMC Sep. 9, 1997, Illustrations 1–23.
Clark Equipment, Bucket Tooth Adater Installation Drawing, No. 1546546, Mar. 13, 1970.

*Primary Examiner*—Meredith C. Petravick
(74) *Attorney, Agent, or Firm*—Banner & Witcoff, Ltd.

(57) ABSTRACT

A wear assembly for attaching wear members to a lip of an excavator includes a wear member, a boss and a lock. The lip includes an inner face, an outer face, a digging edge and a series of through-holes spaced rearward of the digging edge. The bosses are each fixed to a face of the lip at a position rearward of the through-holes. The wear members each include slots to receive the boss adjacent their rear ends, and openings for receiving the locks at a position forward of the bosses. The openings are aligned with the through-holes in the lip. The lock includes a wedge and spool arrangement.

81 Claims, 14 Drawing Sheets

U.S. PATENT DOCUMENTS

| | | |
|---|---|---|
| 4,433,496 A | 2/1984 | Jones et al. |
| 4,449,309 A | 5/1984 | Hemphill |
| 4,457,380 A | 7/1984 | Curry |
| 4,501,079 A | 2/1985 | Hahn et al. |
| 4,540,309 A | 9/1985 | Hansson |
| 4,570,365 A | 2/1986 | Bierwith |
| 4,577,423 A | 3/1986 | Hahn |
| 4,716,667 A | 1/1988 | Martin |
| 4,748,754 A | 6/1988 | Schwappach |
| 5,005,304 A | 4/1991 | Briscoe et al. |
| 5,016,365 A | 5/1991 | Robinson |
| 5,052,134 A | 10/1991 | Bierwith |
| 5,063,695 A | 11/1991 | Briscoe et al. |
| 5,068,986 A | 12/1991 | Jones |
| 5,075,986 A | 12/1991 | Smith et al. |
| 5,088,214 A | 2/1992 | Jones |
| 5,241,765 A | 9/1993 | Jones et al. |
| 5,325,615 A | 7/1994 | Hutchins et al. |
| 5,331,754 A | 7/1994 | Ruvang |
| 5,396,964 A | 3/1995 | Shellhorn et al. |
| 5,410,826 A | 5/1995 | Immel et al. |
| 5,412,885 A | 5/1995 | Cornelius |
| 5,438,774 A | 8/1995 | Fletcher et al. |
| 5,452,529 A | 9/1995 | Neuenfeldt et al. |
| 5,465,512 A | 11/1995 | Livesay et al. |
| 5,469,648 A | 11/1995 | Jones et al. |
| 5,553,409 A | 9/1996 | Irving |
| 5,564,206 A | 10/1996 | Ruvang |
| 5,564,508 A | 10/1996 | Renski |
| 5,634,285 A | 6/1997 | Renski |
| 5,638,621 A | 6/1997 | Keech et al. |
| 5,653,048 A | 8/1997 | Jones et al. |
| 5,713,145 A | 2/1998 | Ruvang |
| 5,718,070 A | 2/1998 | Ruvang |
| 5,806,216 A | 9/1998 | Renski |
| 5,833,323 A | 11/1998 | Massa et al. |
| 5,852,888 A | 12/1998 | Cornelius |
| 5,868,518 A | 2/1999 | Chesterfield et al. |
| 5,909,962 A | 6/1999 | Livesay et al. |
| 5,937,549 A | 8/1999 | Bender et al. |
| 5,937,550 A | 8/1999 | Emrich |
| 5,964,547 A | 10/1999 | Brinkley |
| 5,992,063 A | 11/1999 | Mack |
| 6,009,644 A | 1/2000 | Hedley |
| 6,108,950 A | 8/2000 | Ruvang et al. |
| 6,145,224 A | 11/2000 | Stickling |
| 6,151,812 A | 11/2000 | Bierwith |
| 6,194,080 B1 | 2/2001 | Stickling |
| 6,209,238 B1 | 4/2001 | Ruvang |
| 6,301,810 B1 | 10/2001 | Fidler |
| 6,393,739 B1 | 5/2002 | Shamblin et al. |
| 6,729,052 B2 | 5/2004 | Ollinger, IV et al. |
| 2003/0037468 A1 * | 2/2003 | Adamic et al. ............ 37/455 |

* cited by examiner

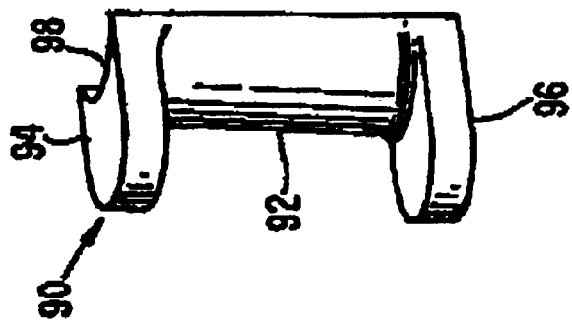
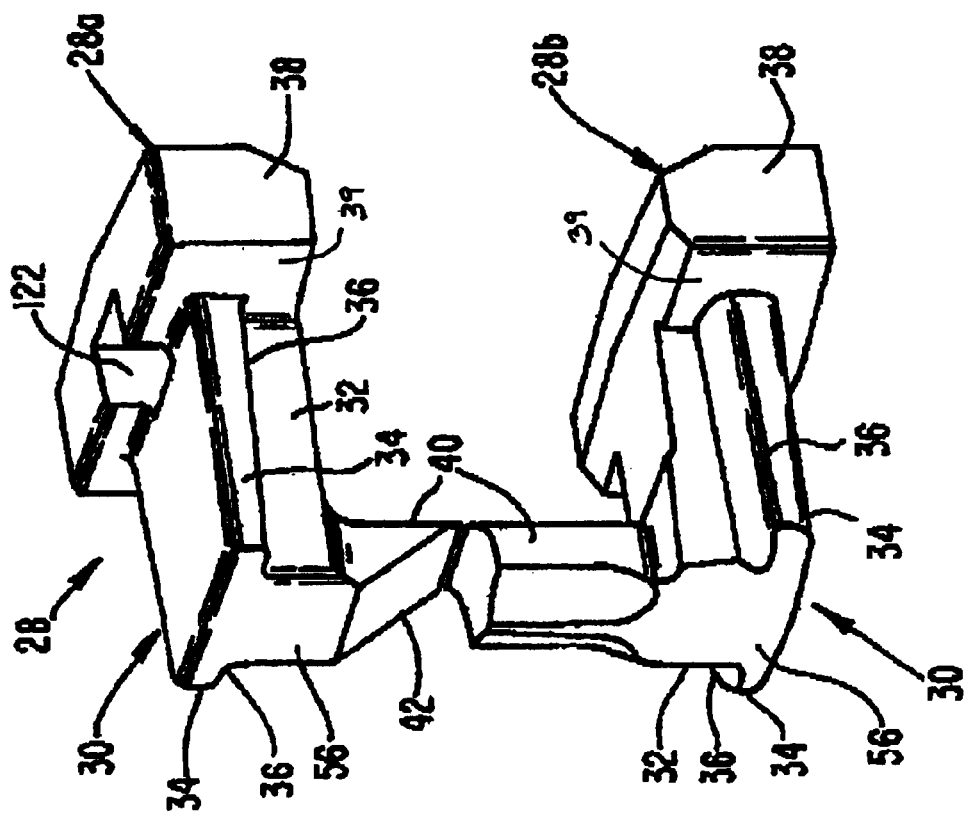

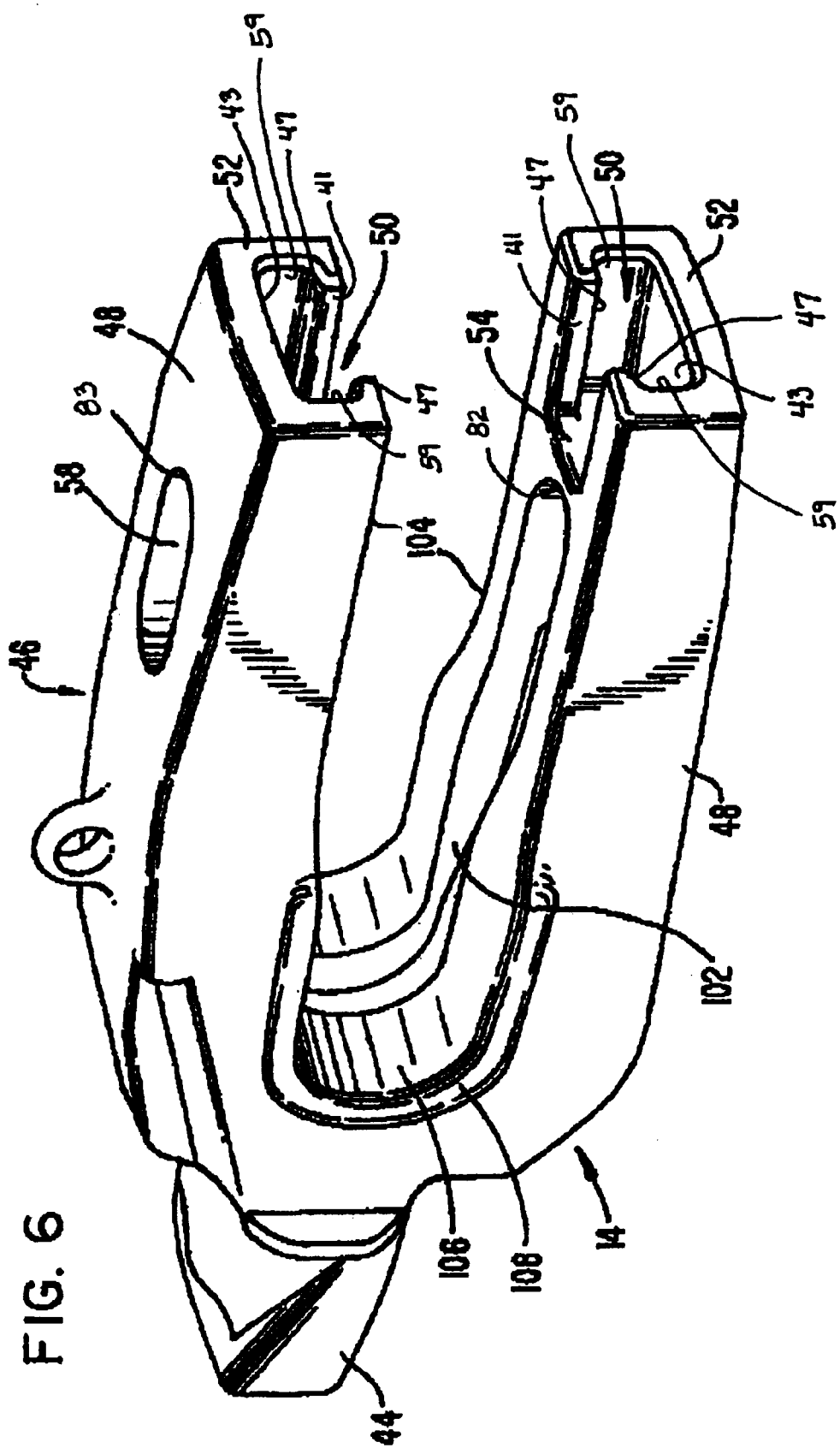

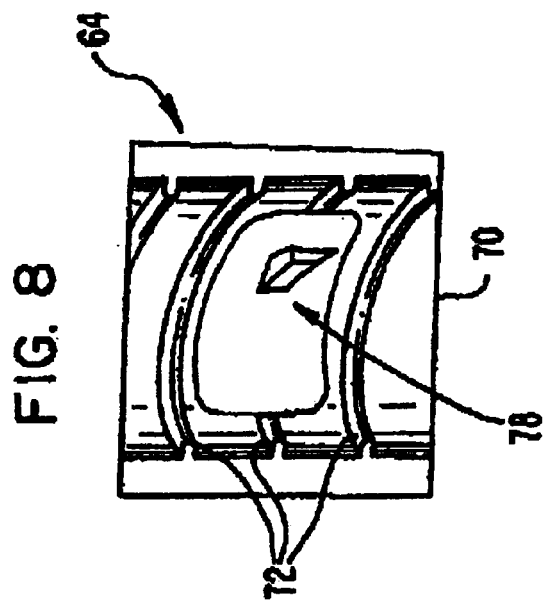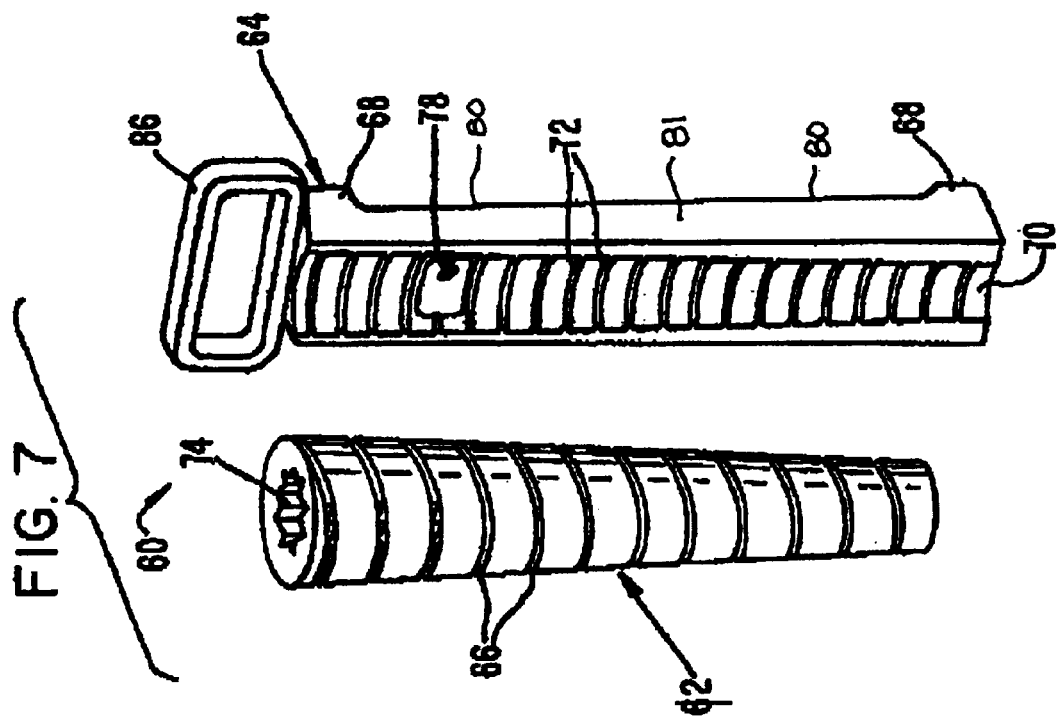

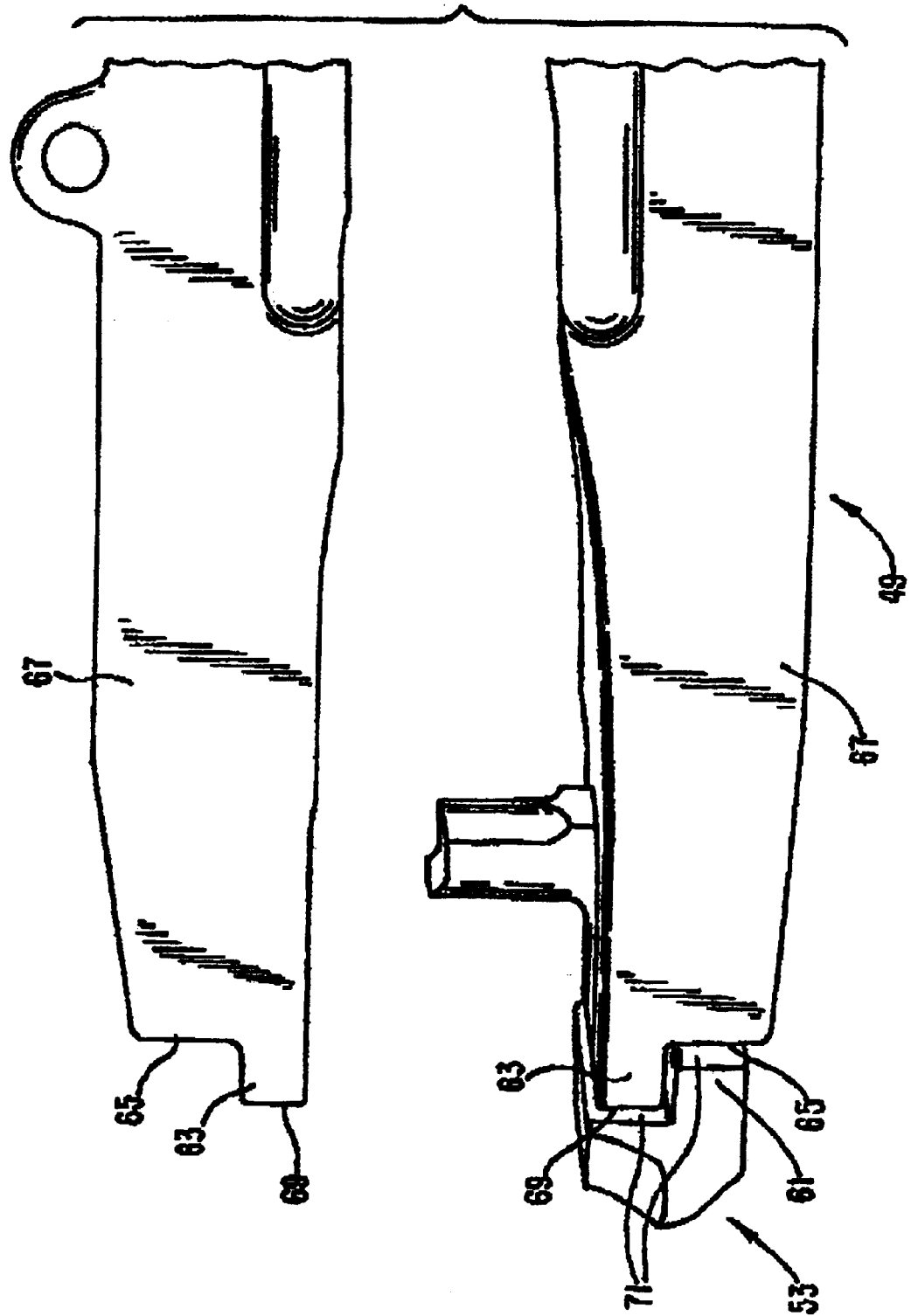

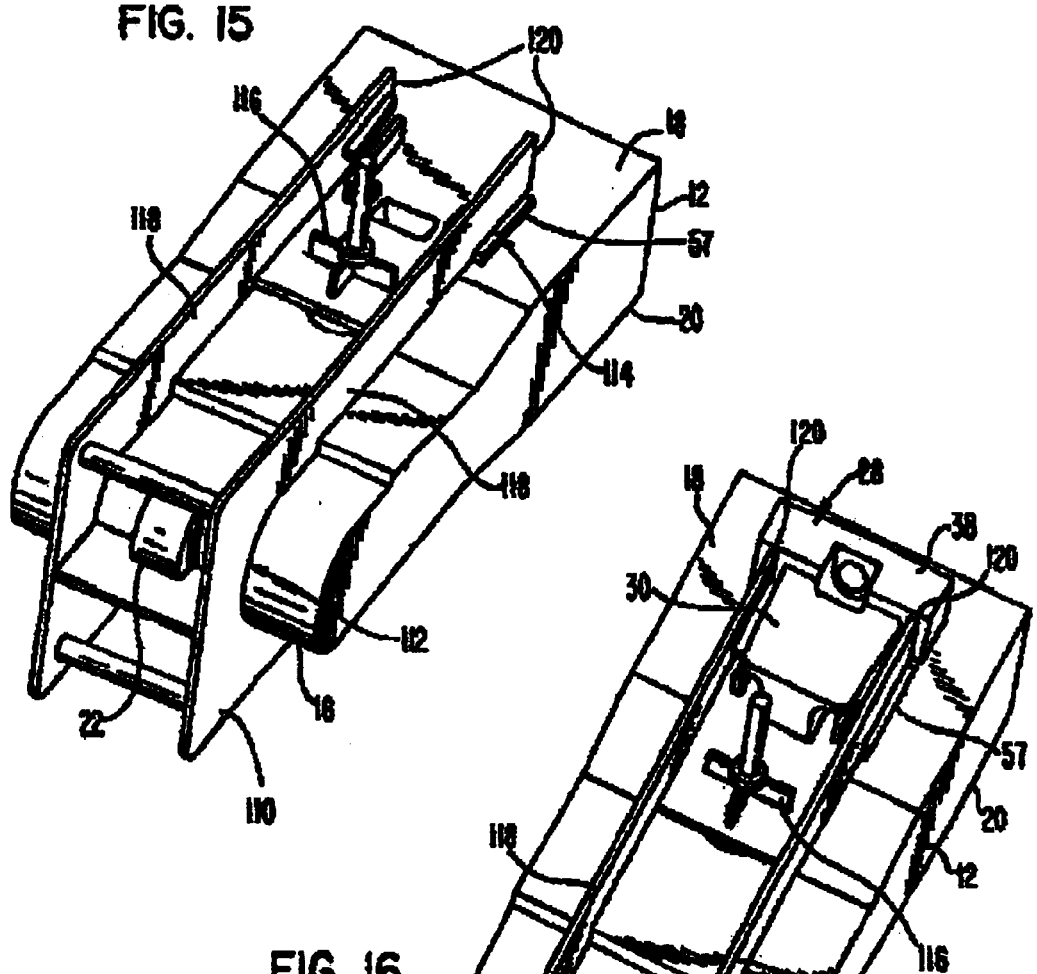

FIG. 18
FIG. 19
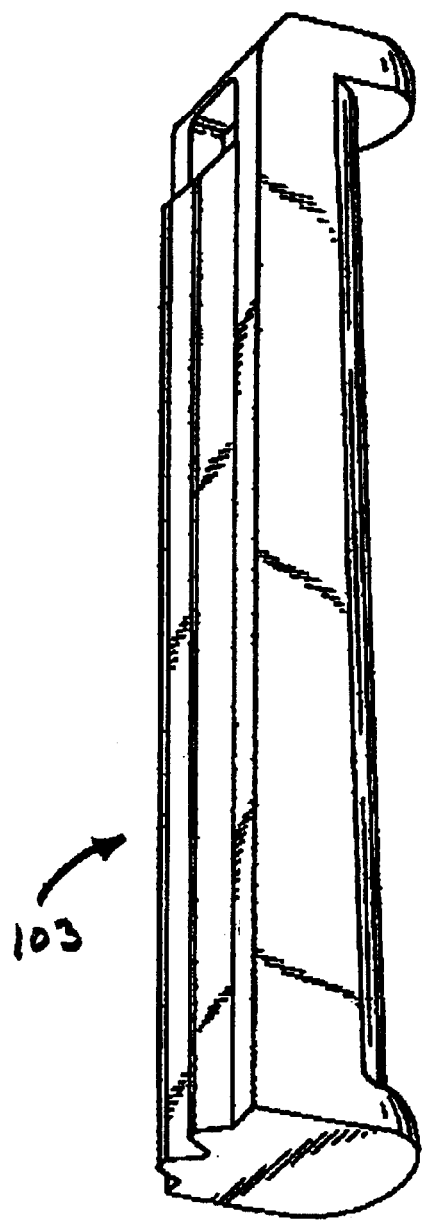

WEAR ASSEMBLY FOR THE DIGGING EDGE OF AN EXCAVATOR

FIELD OF THE INVENTION

The present invention pertains to a wear assembly and particularly for the attachment of a wear member to the digging edge of a bucket or other excavator.

BACKGROUND OF THE INVENTION

It is a common practice to secure wear members in the form of teeth and shrouds along the digging edge of a bucket or other excavator to protect the front lip from premature wear. The teeth project forward of the lip to ease penetration and break up the ground to be gathered in the bucket. The shrouds are mounted to the lip between the teeth. As can be appreciated, the wear members, and particularly the teeth, are often placed in harsh working conditions where they are subjected to very heavy loading and a high degree of wearing.

Excavating teeth are generally composed of a multiple of parts including, for example, an adapter, a point and a lock. The adapter has a rear mounting end configured for attachment to the front lip of the bucket, and a forwardly projecting nose for mounting the point. The point is a tapered member provided with a forward earth-penetrating end and rearwardly opening socket that receives the adapter nose. The lock is fit within the wear assembly to hold the point to the adapter. Although the points wear out most frequently, the adapters are also subjected to wear and require periodic replacement.

Adapters are often welded to the bucket lip, such as in U.S. Pat. No. 4,577,423 to Hahn. Although welding securely attaches the adapter to the bucket to withstand the heavy loads, the replacement of weld-on adapters is difficult and typically performed at a shop rather than in the field. This causes the bucket to be placed out of commission, which, particularly in the case of the larger buckets, can result in a serious economic loss for the operator of a mine or other excavating site. Accordingly, the time and difficulty required to remove and install such weld-on adapters has proven to be a significant deterrent.

To enable replacement in the field, adapters have been developed that are mechanically attached to the bucket lip. The most common is known as a Whisler-style adapter (e.g.; as shown in U.S. Pat. No. 4,267,653 to Hahn). In these arrangements, the rear mounting end of the adapter comprises a pair of bifurcated legs which straddle the bucket lip. Each leg of the adapter includes an opening that is aligned with a through-hole or keyway formed in the lip of the bucket. The rear ends of the legs are formed with ramp surfaces that are inclined upward and away from the respective openings. A spool and wedge are inserted into the aligned openings and through-hole to secure the adapter in place.

More specifically, the spool is generally C-shaped with arms that are configured to matingly engage the ramp surfaces of the legs. Insertion of the wedge between the spool and the front of the through-hole presses the spool rearward with the arms riding over the ramp surfaces of the legs. In this way, the arms pinch the legs against the inner and outer surfaces of the lip to secure the adapter in place. The wedge is usually inserted into the assembly by repeated blows with a large hammer. This can be an onerous and time-consuming task for field workers, especially to achieve the final movement needed to adequately hold the adapter to the lip. Further, the wedge even when tightly inserted can become loose under heavy loading, thus, risking loss of the adapter. A significant contributor to the loosening is actual stretching of the C-shaped spool under service loading, such as when the legs of the adapter shift on the lip under heavy loading. At times, the wedge is welded to the spool in its tightened position in an effort to resist such loosening. This action, however, prevents re-tightening of the lock, which allows assembly looseness, resulting in higher stresses in the wear member and a faster rate of wear on the lip. The welding together of the wedge and spool also causes removal of the lock to be more difficult.

U.S. Pat. No. 5,653,048 to Jones et al. discloses another mechanically attached adapter. In lieu of a through-hole, a boss is welded along the face of the lip. The boss is generally T-shaped and is received in a complementary slot formed in the leg of the adapter. An opening is provided at the rear end of the leg for receiving a lock. The lock, then, abuts the rear end of the boss and the rear wall of the opening to prevent the adapter from sliding forward off the boss and the lip. While this provides good support for most teeth, there is a desire for improvement for use in excavator types that deliver equally large vertical orientation loads from both the top and the bottom directions.

SUMMARY OF THE INVENTION

In the present invention, a wear member is securely attached to the lip of a bucket or other excavator by a mechanical means that facilitates easy installation and removal.

In accordance with one aspect of the present invention, the lip is provided with a through-hole and a boss to secure a wear member in place. The boss and wear member include a tongue and groove arrangement to support the wear member in resisting the applied loads. The through-hole is adapted to receive a lock to prevent removal of the wear member from the lip.

In the preferred construction, the boss is positioned at the rear end of the wear member to provide enhanced resistance to lateral and/or vertical loading. In addition, the lip is formed with a rear member to engage the rear of the wear member and provide additional resistance to axial forces. Such added support functions to protect the lip and provide it with a longer useful life with less maintenance. Preferably, the rear member is formed as part of the boss, to complement the support provided by the boss and better stabilize the mounting of the wear member on the lip. Moreover, irrespective of whether the rear member functions as an abutment, the rear member is preferably provided and fixed to the rails for enhanced support.

The wear member preferably has a pair of rearwardly extending bifurcated legs that each includes an inner surface to face the lip, a rear wall, a slot that opens in the inner face and the rear wall to receive a boss to resist loads applied during use, an opening forward of the slot for receiving a lock to retain the wear member on the lip, and a lateral wall extending between the slot and the opening.

In one construction, the bosses are formed to be generally L-shaped with a stem that fits into the rear end of the through-hole in the lip, and a main body that lies along a face of the lip to cooperate with the wear member. Bosses are preferably provided along the inner face and the outer face of the lip to hold the inner and outer legs of the wear members. The interconnection of the legs and bosses resists shifting of the legs which in the past has led to the stressing, bending and loosening of the locks. Preferably, the bosses are welded to the lip and to each other in the through-holes. In this way, a lip formed to accommodate a Whisler-style adapter can be easily modified to make use of the present invention.

In one preferred embodiment, a threaded wedge and spool assembly is used to secure the wear member in place on the lip. Specifically, a conically shaped wedge includes a thread structure that engages a cooperating thread structure on the spool so that the wedge is driven into and out of the through-hole via rotation of the wedge. The use of a threaded wedge and spool eases installation and removal of the lock, and reduces the risk of lock loss during use of the excavator. Moreover, the threaded wedge can be easily retightened to keep the wear member snugly mounted on the lip.

In another aspect of the invention, an insert is provided at the front end of the through-hole to provide increased bearing support for the wedge through a longer bearing length and a higher hardness, less deformable material than is possible in the lip itself.

The present invention significantly increases the strength and stability of the wear member on the lip, leading to longer service life of the wear member and a reduced maintenance requirement on the lip. With use of the preferred locking device, it also increases ease and safety in fixing wear members to a lip of a bucket or other excavator. No large hammers are required to install or remove the lock. The need to work under the lip to remove the lock is eliminated. The locks can be removed and installed quickly and easily to greatly ease the replacement of the wear members in the field or elsewhere.

The placement of the boss at the rear of the wear member offers maximum possible resistance to vertical and lateral loads applied to the teeth during use. The abutments further stabilize the teeth and reduce stress on the front of the lip by resisting axial loads. The bosses can be attached to new lips formed to use the bosses or to existing lips that were originally constructed to mount Whisler-style adapters. This additional stability along with the retightening advantage of the lock reduces the frequency of lip maintenance and provides longer adapter service.

BRIEF DESCRIPTION OF THE DRAWINGS

FIG. 4 is a perspective view of the two bosses to be attached to the lip.

FIG. 5 is a perspective view of a keyway insert in accordance with the present invention.

FIG. 6 is a rear perspective view of a wear member in accordance with the present invention in the form of an adapter.

FIG. 7 is an exploded view of a lock in accordance with the present invention.

FIG. 8 is an enlarged front view of a portion of the spool showing a ratchet pawl.

FIG. 14 is a partial perspective view of the combination of the boss and adapter illustrated in FIGS. 12 and 13 without the lip or inner boss.

FIG. 15 is a perspective view of the use of a gauge fixture to retrofit a lip to use preferred aspects of the present invention.

FIG. 16 is a perspective view of the gauge fixture being used to position and attach the bosses of the present invention to a lip.

FIG. 18 is a perspective view of a wedge of an alternative lock.

FIG. 19 is a perspective view of a spool to cooperate with the wedge of FIG. 18 in forming the alternative lock.

DETAILED DESCRIPTION OF THE PREFERRED EMBODIMENTS

Figure 1:
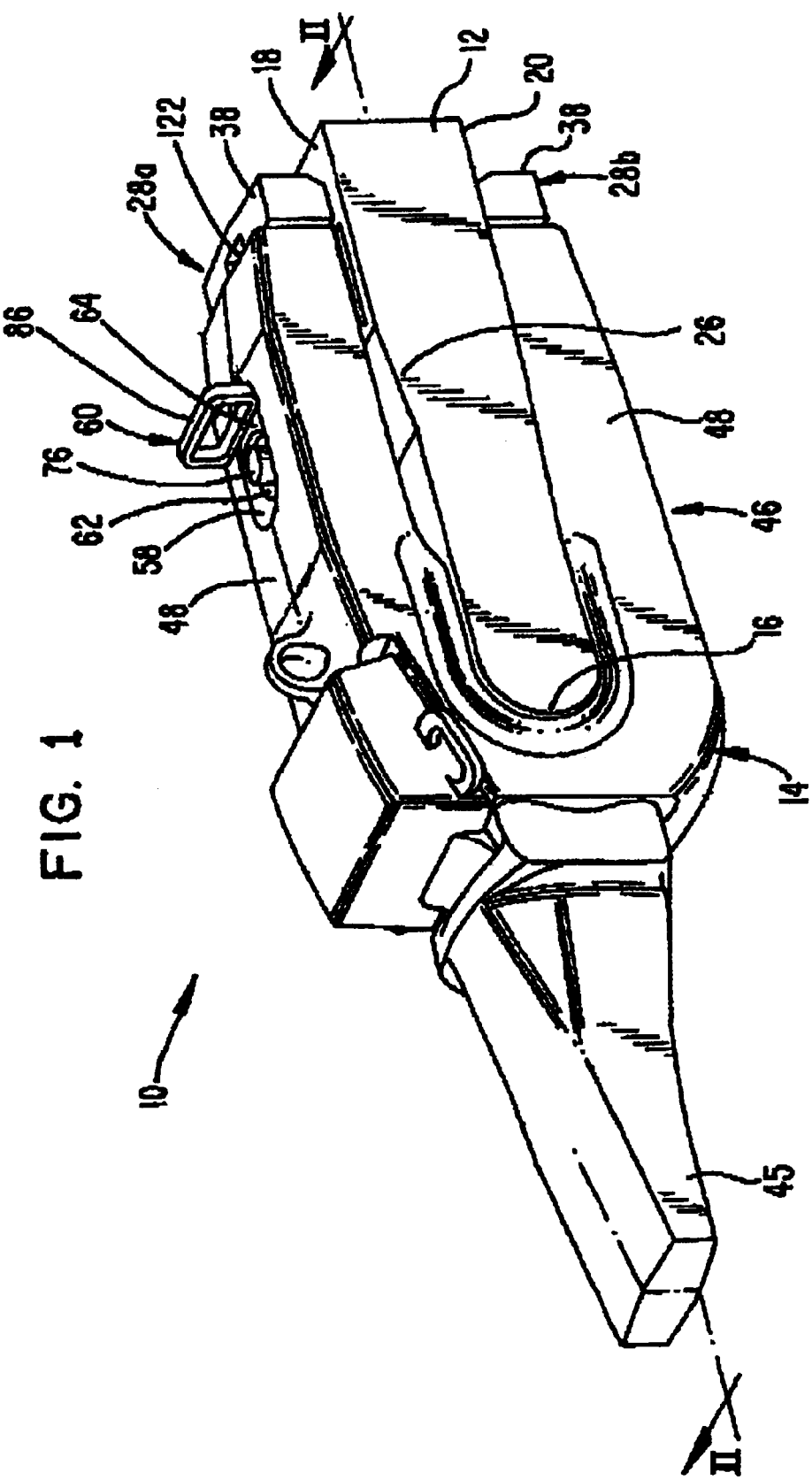
FIG. 1 is a perspective view of a wear assembly in accordance with the present invention.

The present invention relates to a wear assembly 10 for mounting a wear member to a bucket or other excavator (FIG. 1). The present invention is particularly suited for mounting an adapter 14 for an excavating tooth to a lip, but could also be used to secure other wear members, such as shrouds. For ease of discussion, the invention will be described in terms of mounting an adapter to a lip of a bucket.

In one example, lip 12 defines a digging edge 16 of a bucket, and includes an inner face 18 and an outer face 20 (FIGS. 1–3 and 9). A front tab 22 preferably projects forward from the digging edge to aid in placing and supporting the adapter 14. A through-hole or keyway 24 is provided in the lip directly rearward of tab 22. While only a small portion of the lip is shown in the drawings, the lip would ordinarily include a series of spaced apart tabs and through-holes for the mounting of several teeth to the bucket. In the illustrated embodiment, the lip has a rounded digging edge 16 and an expanding region 26 by the through-holes 24. Nevertheless, many other lip configurations are possible for use with the invention.

Bosses 28 are fixed to the lip rearward of and in alignment with each through-hole 24 (FIGS. 1–4 and 9). Preferably, an inner boss 28a is secured to extend along inner face 18 of lip 12 and an outer boss 28b is secured to extend along outer face 20 for each through-hole. Nevertheless, a single boss on the inner face 18 (or outer face 20) could be used. Although the bosses are preferably welded to the lip, they could be formed as an integral portion of the lip or attached by mechanical means. Also, while the bosses are preferably fixed directly adjacent the through-holes 24, they could be spaced rearward of the through-holes if desired.

Figure 12:
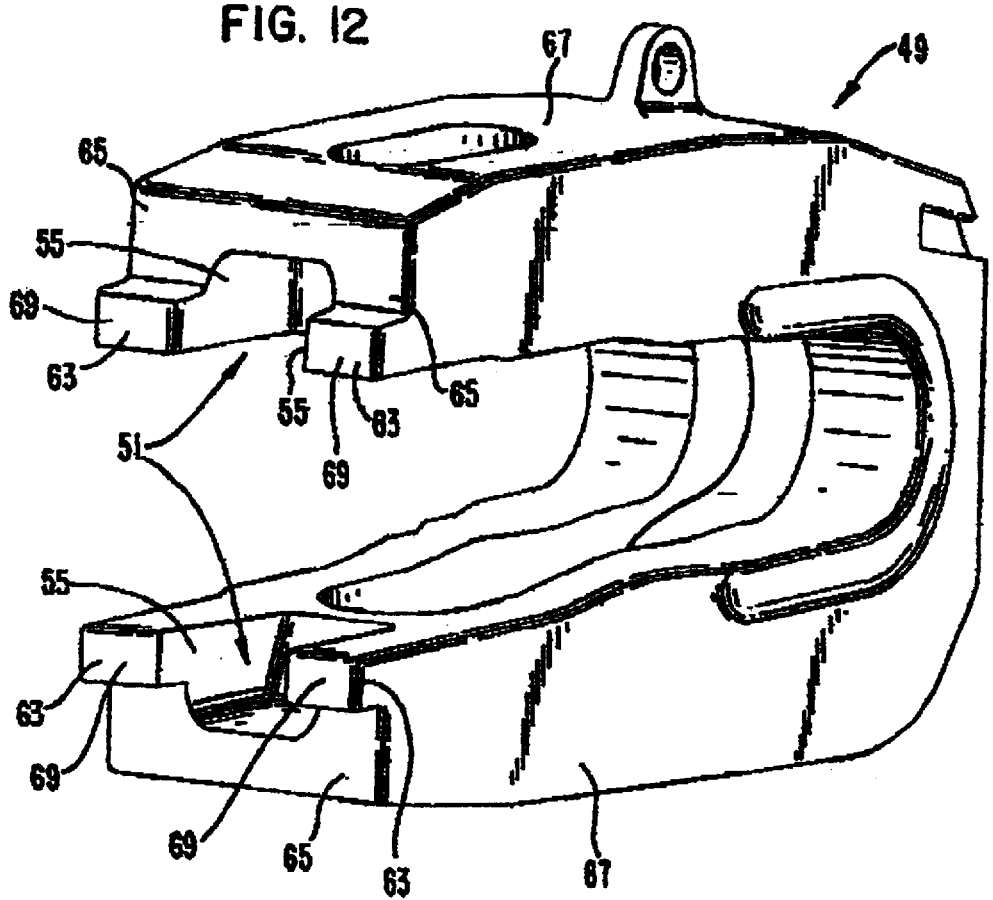
FIG. 12 is partial, rear perspective view of an alternative adapter.
Figure 13:
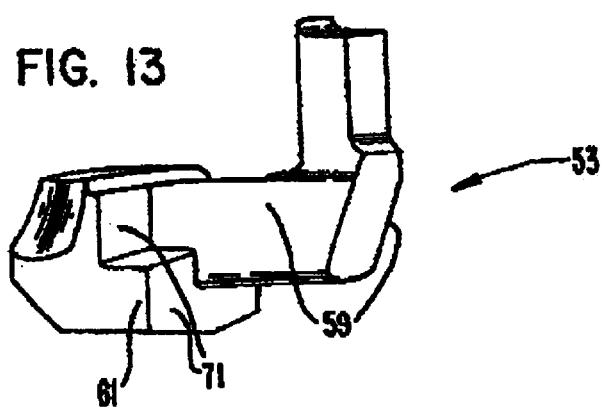
FIG. 13 is a perspective view of an alternative outer boss to cooperate with the adapter of FIG. 12.
Figure 17:
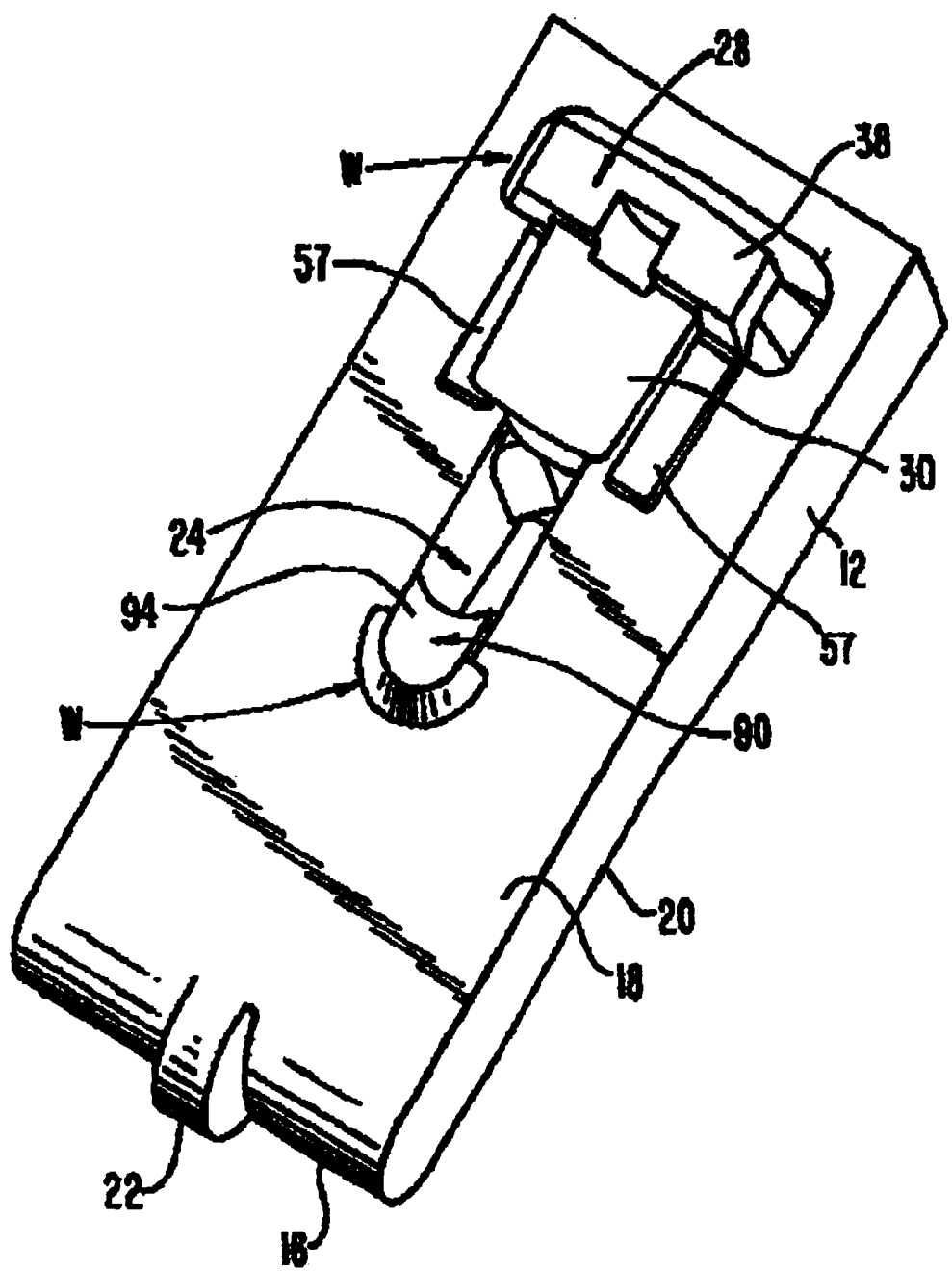
FIG. 17 is a perspective view of the preferred weld pattern in fixing the bosses and keyway insert to a lip.

Each boss 28 includes at least a main body 30 that extends in axial alignment with a through-hole 24 along either the inner face 18 or outer face 20 of the lip. The main body 30 preferably has a T-shaped configuration with a base 32 and laterally extending flanges or rails 34. The undersides of the rails 34 define holding surfaces 36 that generally face the lip to hold the adapter to the lip. Nevertheless, the main body could have other similar shapes (such as a dovetail configuration), other formations that provide other rails or holding surfaces facing the lip (see, e.g., the later discussed alternative embodiment in FIGS. 12–14), or even a parallelepiped or other shape with no rails or holding surfaces. Although a boss with no lateral rails or holding surfaces does not hold the adapter to the lip in the same way as a T-shaped boss or the like, it does still provide lateral support for resisting the applied loads. Additionally, the tongue and groove arrangement could be reversed such that the boss defines the slot that receives a tongue defined by the wear member. In this arrangement, the holding surfaces of the boss that resist outward movement of the wear member (i.e., away from the lip) still generally face toward the lip but are contained in the slot of the wear member.

The bosses are also preferably longitudinally tapered, widening toward the rear, to facilitate ease of installation and removal of the wear member. However, bosses with no such longitudinal taper are possible, particularly where there is inadequate space available to include the taper.

The bosses 28 also preferably each includes a rear member 38 at the rear end of the main body 30 to provide enhanced support for the laterally extending rails 34 or the like. In particular, rear member 38 is fixed to the lip and along the lateral projections of the rails, at their rear ends, to strengthen the rails in resisting the applied loads. When outwardly extending rails are used (e.g., as in FIG. 3), the rear member is fixed to and extends laterally outward of at least part of the main body to provide enhanced support for rails 34. When the boss defines the slot, the rails project inward, thus requiring no lateral outward extension of the rear member. While rear member 38 can be spaced from the rear wall 52 of adapter 14 during use, it can also be positioned to abut the adapter (FIGS. 1–4 and 9). In the illustrated embodiment, rear member 38 extends at least laterally beyond the base 32, and preferably, also laterally and outwardly beyond rails 34 when abutting adapter 14 to maximize the surface area to abut the rear end of the adapter. This abutment provides support to resist the applied loads and rearward shifting of the legs so as to reduce the loads applied to the digging edge 16 of lip 12. Precluding axial shifting of the legs also reduces the stresses imposed on the lock and the risk that the lock will loosen during use. When used to abut adapter 14, rear walls 52 of the adapter may be machined to assure close positioning of front surface 39 to rear walls 52 when the adapter is first slid onto the lip and abuts digging edge 16. By relieving the pounding and stress applied to the digging edge of the lip, as compared to a conventional Whisler-style adapter, the lip will last longer and require less maintenance during its useful life. Ordinarily, in a conventional Whisler-style adapter, the front of the lip suffers considerable abuse and must periodically be built up with weld or other material. Although the rear member is preferably formed as part of the boss, it could be a separate part secured to or cast integrally with the lip.

In a preferred embodiment, each boss additionally includes a stem 40 that extends into the adjacent through-hole 24. The stem provides greater support for the boss against the applied loads, particularly when rear member 38 is formed as an abutment part of the boss. The stem also enables the inner and outer bosses 28a, 28b to be welded to each other to effect a clamping or gripping of the lip by the bosses and thereby enhance the strength of the attachment of the bosses to the lip. To ease this interconnection of bosses 28a, 28b, the ends of the two stems, together, preferably form a weld groove 42 to facilitate a welding procedure from above the lip of the bucket. The stems are also preferably welded to the lip within through-hole 24. Nevertheless, the stems could be omitted, particularly when used in environments with less severe loading.

Adapter 14 is a wear member that is mounted to the lip of a bucket to hold the earth-penetrating tooth points in place (FIGS. 1–2, 6 and 9–11). Adapter 14 includes a forwardly projecting nose 44 for mounting a point 45 (FIGS. 1 and 2), and a mounting end 46 with bifurcated legs 48 to straddle the lip 12. In the preferred embodiment, the legs are of equal length and are each provided with a slot 50 shaped to receive the inner and outer bosses 28a, 28b. In the illustrated embodiment (FIG. 6), the slot is T-shaped to matingly receive bosses 28. However, the slot could vary so long as the slot shape still receives the boss to provide the desired support to resist lateral or outward pressures on the legs. Moreover, the shape of the slot can vary depending on the shape of the boss and the loads to be resisted. Further, limited advantages can be obtained through the use of a boss and slot on only one of the inner and outer faces 18, 20 of the lip, although better support is provided through the use of both bosses 28a, 28b.

As seen in FIG. 6, the slots 50 are open in the rear walls 52 of legs 48 to slidingly receive the bosses therein. Each said slot 50 preferably includes a recessed wall 43 spaced from and facing the respective face 18, 20 of lip 12. A narrowed portion 41 sets between the recessed wall 43 and the lip to define retaining surfaces 47 to oppose holding surfaces 36 and retain rails 34 in grooves 59 of slot 50. Each slot 50 preferably extends forward only a short distance from rear wall 52; i.e., a distance approximately equal to the length of the main body 30 of the boss. In this way, the lateral wall 54 at the front of slot 50 can abut the front wall 56 of boss 28 as rear wall 52 of leg 48 abuts rear member 38 to resist axially applied loads. By using both the front wall 56 and rear member 38, the surface area resisting the loads can be maximized to lower the stress in the wear member 10 and lip 12. Lateral wall 54 can extend entirely across slot 50 as shown (FIGS. 6 and 12) or only partially across (not shown). It should, however, be understood that it not necessary for the front wall 56 of main body (or front member) 30 or the front wall 39 of rear member 38 to abut the adapter 14.

In another embodiment (FIGS. 12–14), an alternative adapter 49 includes slots 51 without a T-shape or similar construction. Specifically, slots 51 and bosses 53 have complementary, generally flat sidewalls 55, 59 that extend generally perpendicular to the faces 18, 20 of the lip. In place of flanges or rails 34 along the sides of the bosses, bosses 53 include a forwardly projecting flange or overhang 61 spaced from the respective lip 18, 20. Fingers 63 project rearward from rear ends 65 of adapter legs 67 to fit between flange 61 and lip 12 to prevent outward movement of the adapter legs 67 relative to lip 12, and thereby support the legs against heavy upward or downward directed loads applied to the point. In addition, the rear ends 65 of legs 67 and rear ends 69 of fingers 63 preferably abut front faces 71 of boss 53 to reduce the loads applied to digging edge 16 of lip 12, but could be formed with a gap to avoid such abutment. Nevertheless, as noted above, fingers 63 and flanges 61 could be omitted so that there are no transverse holding surfaces to resist the legs moving away from the lip.

As can be appreciated, the primary loads on the teeth are applied at the earth-penetrating front ends of the points. As the teeth are forced through the ground, the points are subjected to loads of varying intensity, kind, and direction. As a result, many of the applied loads press on the points at angles to the longitudinal axis of the tooth. Hence, large forces are applied to the adapter holding the point to the bucket. By fitting the rear ends of legs 48 over the fixed bosses 28 (FIGS. 1 and 2), the bosses are able to effectively resist the reaction forces in all directions with bosses shaped with rails or other holding surfaces and at least in lateral directions with bosses without rails or holding surfaces. In the preferred embodiment, the bosses function in cooperation with lip pads 57 to support the legs, but, alternatively, they can provide the entire support for the back ends of the adapter legs.

A hole or opening 58 extends through each leg 48 forward of slot 50 to receive a lock 60 (FIGS. 1–2, 7–8 and 10–11). Lock 60 is described in detail in copending U.S. patent application Ser. No. 10/425,934, entitled Releasable Coupling Assembly filed concurrently with this application, and hereby incorporated in its entirety by reference.

Briefly, lock 60 includes a wedge 62 and spool 64 that are threadedly coupled together to tightly hold the adapter to the lip. Wedge 62 has generally a frusto-conical shape with a helical groove 66 forming a thread formation. The spool 64 has a generally C-shaped configuration with two arms 68 and a channel 70 adapted to receive a portion of the wedge. The channel includes spaced apart helical ridge segments 72 to form a thread formation to complement helical groove 66. As the wedge is rotated, the engaged thread formations cause the wedge to move axially along the spool, and hence, into and out of the aligned openings 58 and through-hole 24. A recess 74 with flats is provided in one end of wedge 62 for engaging a wrench. A rubber cap 76 can be fit into the recess 74 during use to prevent earthen fines from becoming embedded therein.

A resiliently biased pawl 78 (FIG. 8) is preferably provided in the spool to engage a series of ratchet teeth (not shown) formed in the helical groove. The pawl is preferably formed in channel 70 along one of the ridge segments, although it could be formed in other wall surfaces adjacent wedge 62. In any event, pawl 78 engages the teeth as the wedge is rotated such that the wedge can be turned to drive the wedge into the through-hole 24 but prevented from turning in a direction that drives the wedge out of the through-hole. The pawl can be broken by application of a wrench on wedge 62 to remove the wedge from the assembly.

Figure 2:
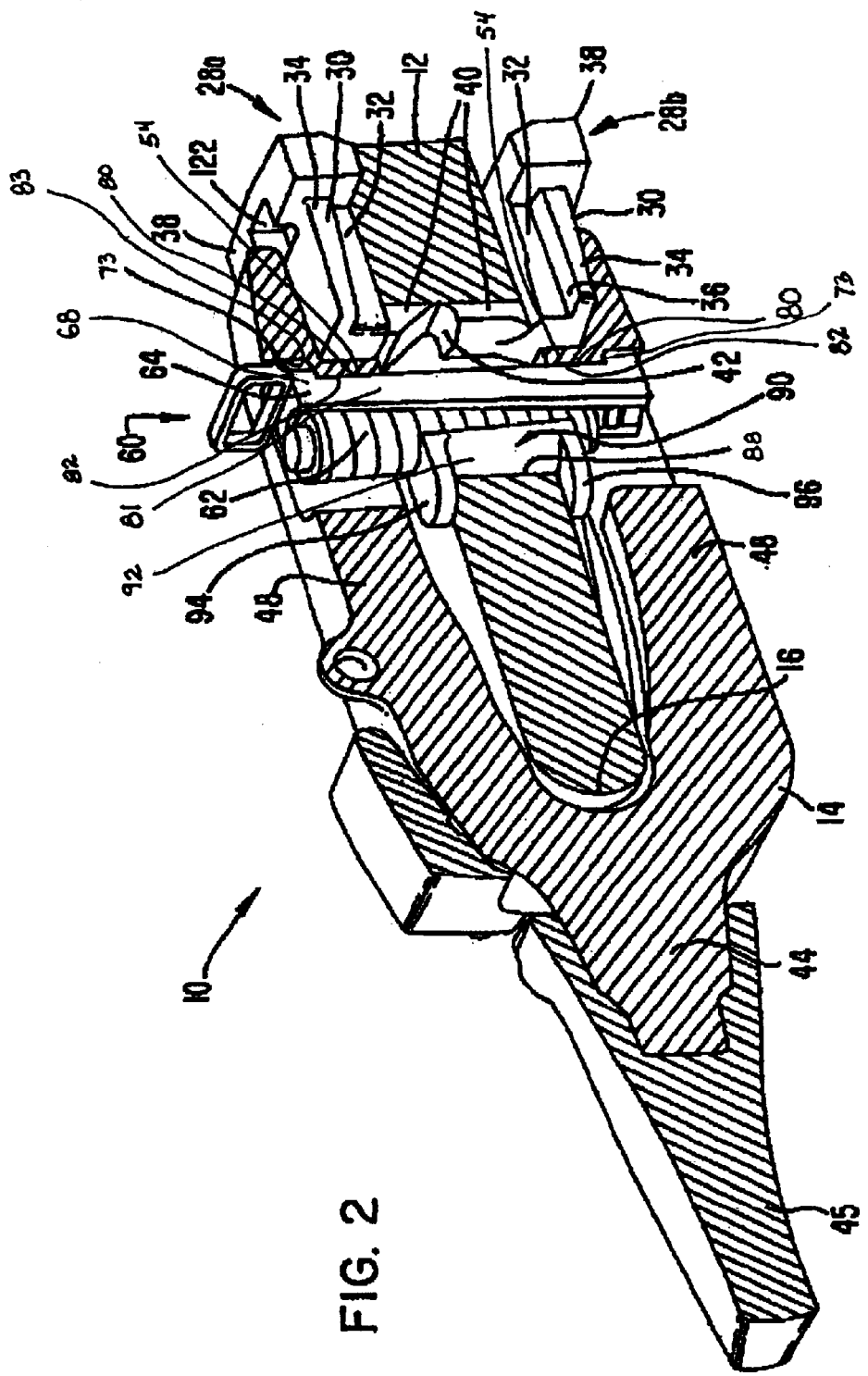
FIG. 2 is a cross-sectional view taken along line II—II in FIG. 1.
Figure 3:
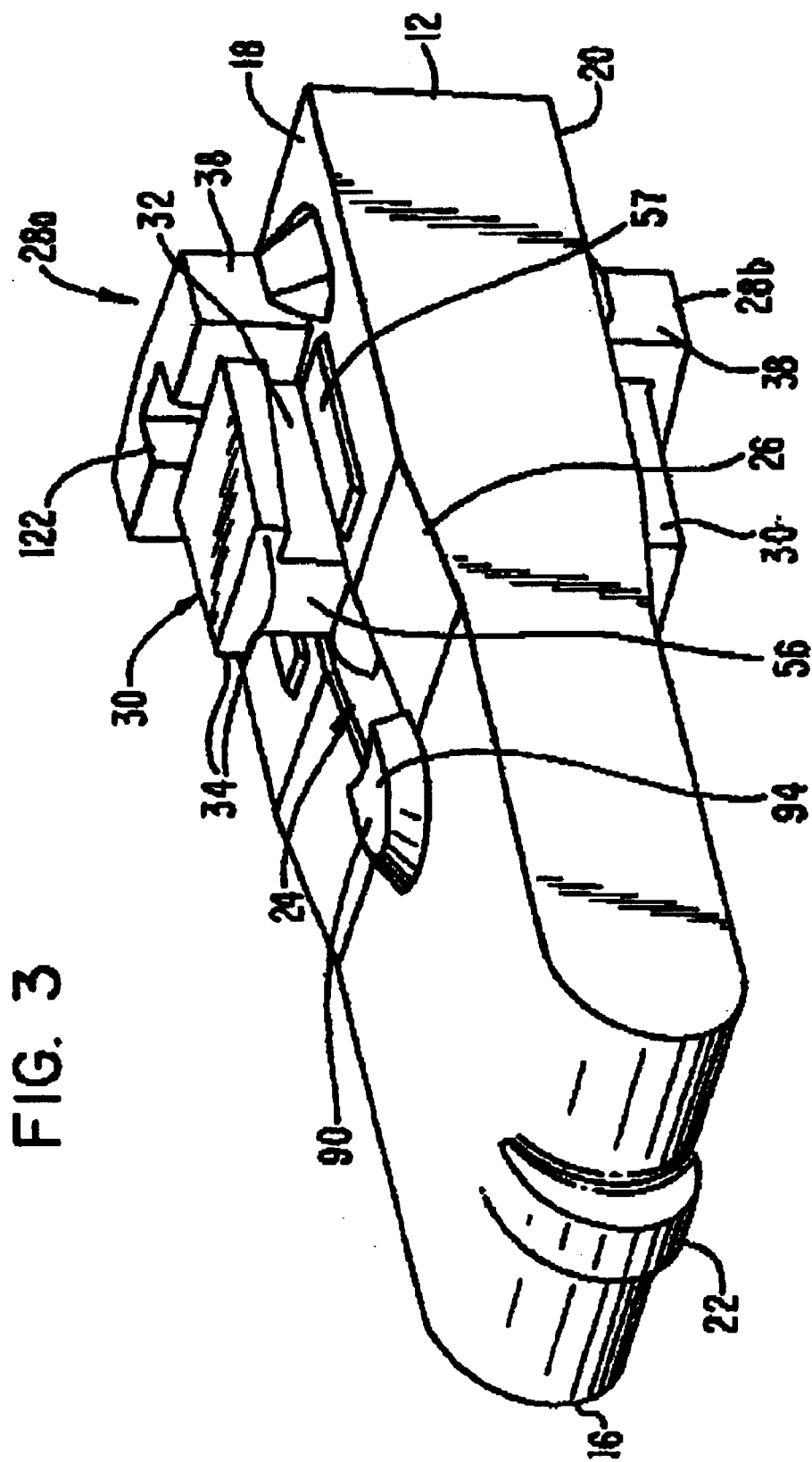
FIG. 3 is a perspective view of a portion of a lip of an excavator with bosses attached in accordance with the present invention.
Figure 9:
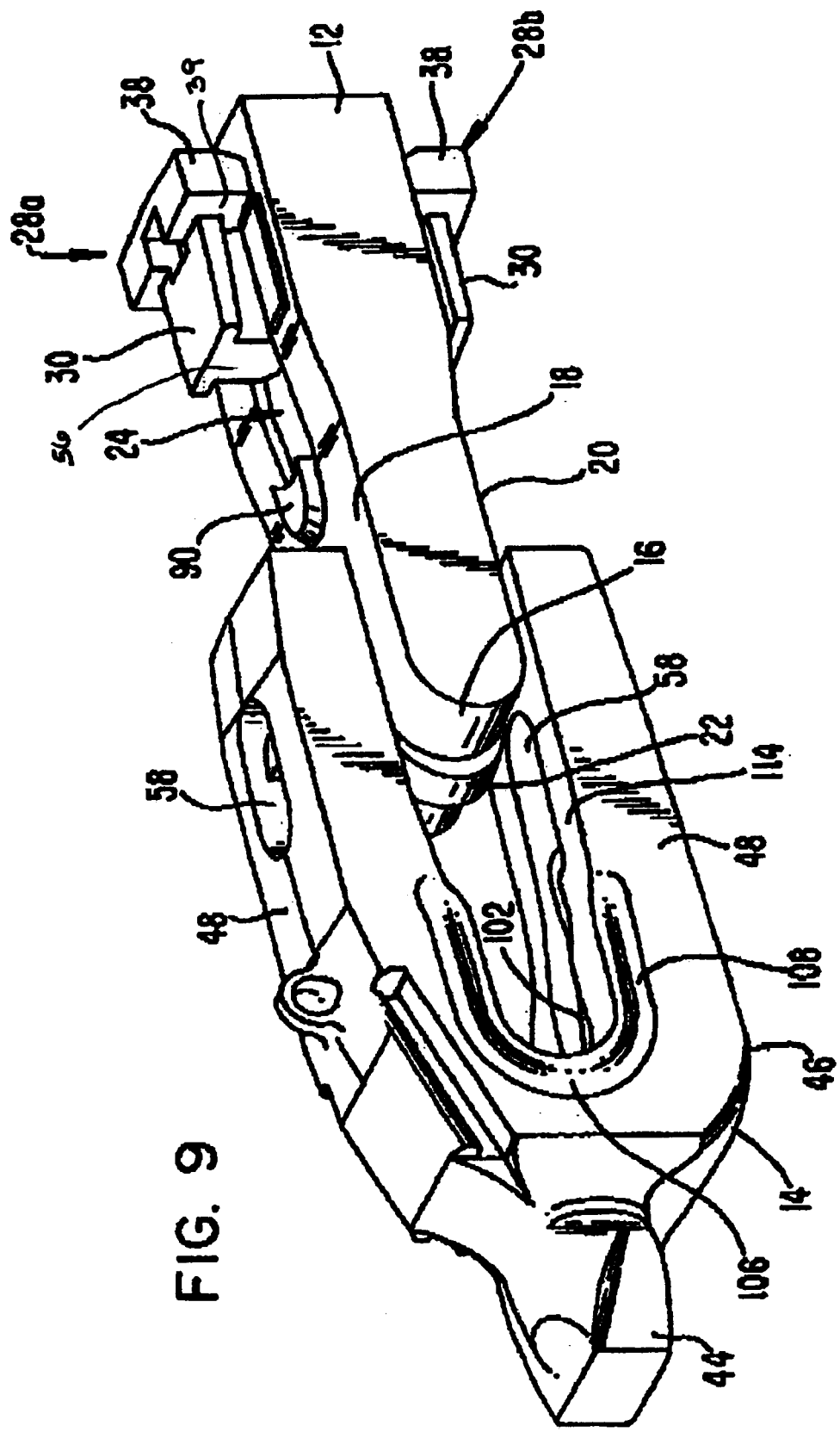
FIG. 9 is a perspective view showing a wear member partially fit onto a lip provided with the bosses of the present invention.
Figure 10:
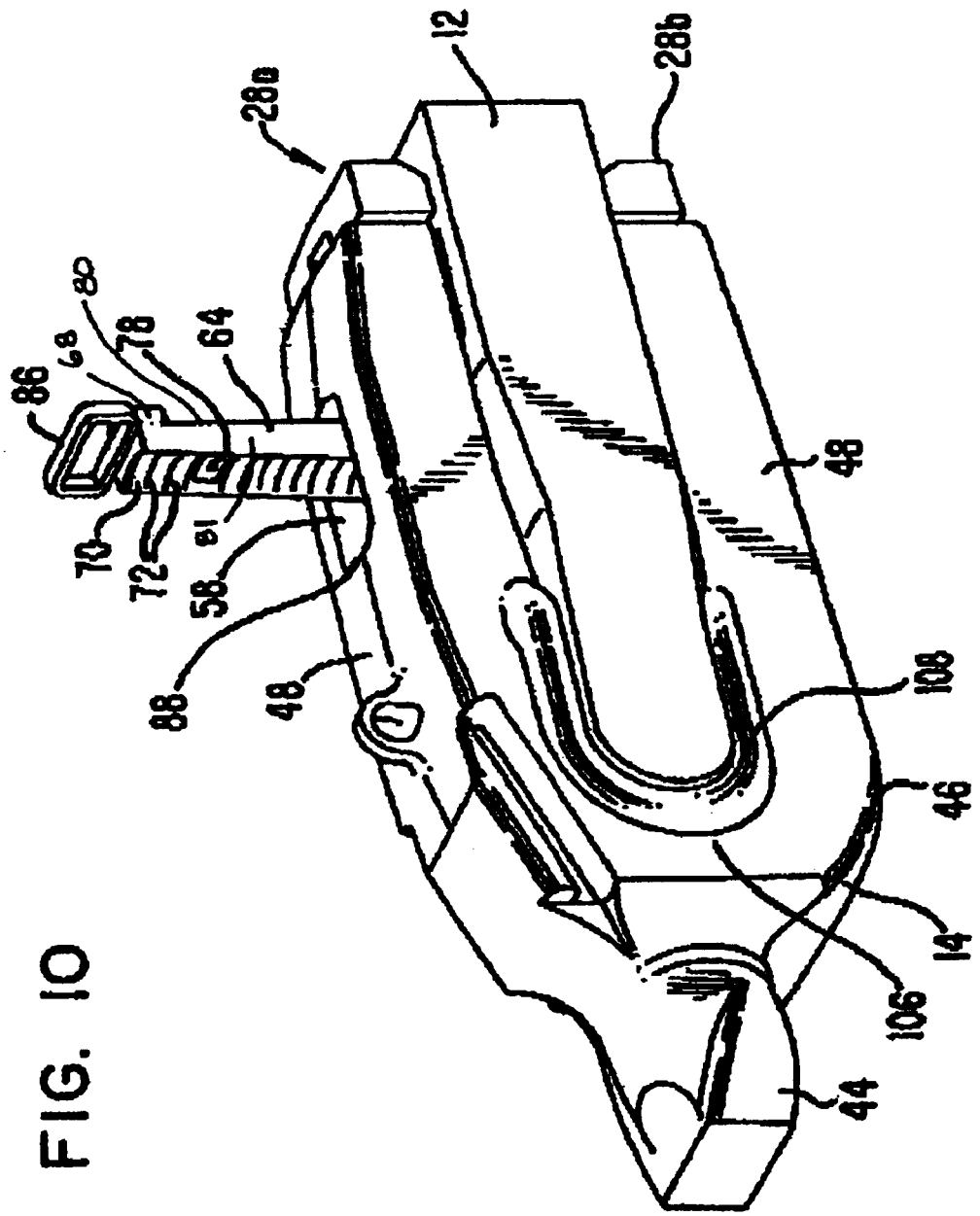
FIG. 10 is a perspective view of a spool being fit into a wear assembly in accordance with the present invention.
Figure 11:
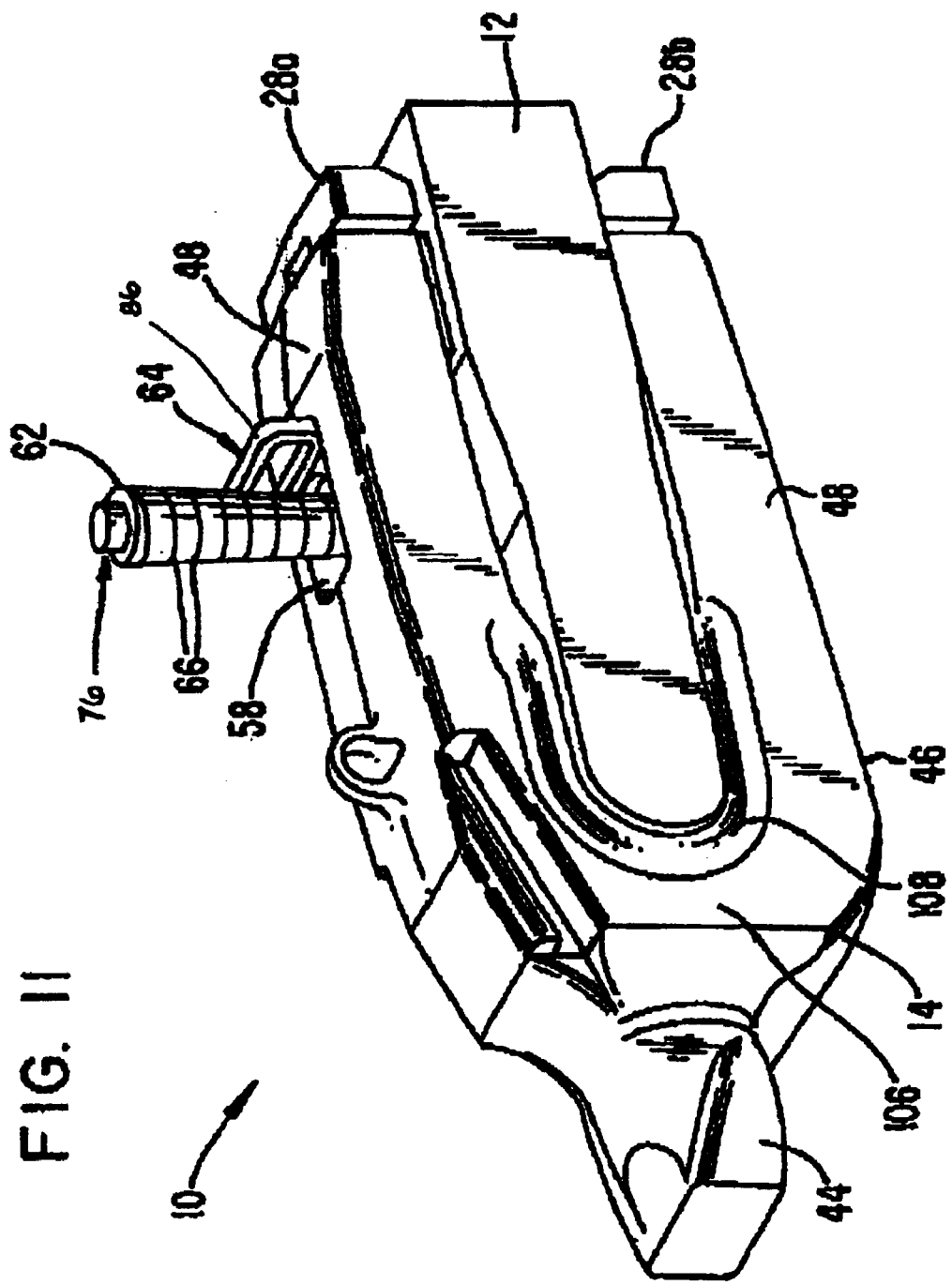
FIG. 11 is a perspective view of a wedge being fit into a wear assembly in accordance with the present invention.

In use, spool 64 is inserted into openings 58 and through-hole 24 such that surfaces 80 along shank portion 81 abut the front face 82 of lateral wall 54 (FIGS. 2 and 10). As seen in FIG. 2, openings 58 each preferably includes a pocket 83 for receiving arms 68. In this way, the spool is anchored to prevent the spool from moving as the wedge is rotated. Nevertheless, other arrangements besides the use of arms 68, such as flanges on the adapter, could be used to secure the spool in the assembly. With such other securing means, arms 68 could be omitted. A handgrip 86 is provided for the operator to position and temporarily hold the spool in place while the wedge is inserted. Once the spool is in its proper position, the wedge is inserted into channel 70 and turned to drive the wedge tightly into place (FIG. 11). While the wedge can abut directly against the front end 88 of through-hole 24 (FIG. 2), a keyway insert 90 is preferably welded into place at the front of through-hole 24.

Keyway insert 90 preferably has a generally C-shaped configuration with a central body 92, an inner flange 94 and an outer 96 flange (although other shapes are possible). Inner and outer flanges 94, 96 overlie and are welded to the inner and outer faces 18, 20, respectively, of lip 12. The rear surface 98 of central body 92 is preferably arcuate to receive the front side of wedge 62. Keyway insert 90 functions to provide a longer and more deformation resistant bearing surface for wedge 62. Also, it provides a maintenance advantage in that it can be replaced, whereas, weld re-building of the keyway is not only difficult, but can actually result in a failure of the lip due to the heat affects of welding in a high stress zone.

The threaded wedge and spool could be replaced with a conventional fluted wedge 101 (FIG. 18) and fluted spool 103 (FIG. 19) where the wedge is hammered into place. Alternatively an unthreaded wedge (not shown) having the same conical shape or a generally block shape (i.e., with generally flat walls) could be used. In the case of the conically shaped wedge, the channel in the spool would be formed without the ridge segments and the pawl (not shown). In the case with flat wedge walls, the spool (not shown) would be modified to provide a generally flat front surface instead of channel 70. The unthreaded wedges would in either case be hammered into place as is common with a lock for a conventional Whisler-style adapter.

Adapter 14 further preferably includes a central groove 102 along inner surfaces 104 of legs 48 and bight portion 106. The central groove is adapted to fit about tab 22 for additional support of the adapter. The central groove also accommodates keyway insert 90 during axial sliding of the adapter onto and off of the lip. The bight portion 106 is preferably built up with an outer lip 108 to provide greater support and a larger surface area in contact with the digging edge 16 of lip 12.

The present invention is amenable to being used with existing lips initially constructed to be used with conventional Whisler-style adapters. In these situations, it may be necessary to adapt the lip to better accommodate the attachment of adapters 14. A gauge fixture 110 as shown in FIGS. 15 and 16 can be slid over the lip and bayonet 116 inserted to determine where the lip should be built up. In particular, it may be desirable to build up the digging edge 16 and pads 57 with weld material until they contact front portions 112 and rear portions 114 of gauge fixture 110. It may also be desirable to grind a radius around the inner and outer edges of through-hole 24. Bosses 28 are positioned by legs 118 of gauge fixture 110 with stems 40 in through-hole 24 and rear member 38 against the rear ends 120 of gauge fixture 110. The bosses are preferably welded to lip 12 along the sides and rear surface of the rear member 38, to each other via notch 42, and to the lip along the stems 40 in through-hole 24. The main bodies 30 of bosses 28 may also, if desired, be welded along lip 12. The keyway insert 90 is also placed into through-hole 24 at its front end, and welded to lip 12 along the front ends of flanges 94, 96, keeping the weld away from the high stress region of the through hole.

In assembly, the adapter is rearwardly slid onto the bucket with one leg 48 to each side of the lip 12 so that bosses 28 are received into slots 50. The rearward movement of adapter 14 continues until bight portion 106 abuts digging edge 16. In the preferred construction, the front wall 54 of slot 50 abuts against boss 28 and/or rear wall 52 against rear member 38 only after wear begins to develop due to use of the bucket. Nevertheless, if desired, these other surfaces could be formed as the first abutting face instead of bight portion 106. Once the adapter is properly positioned, lock 60 is inserted into openings 58 and through-hole 24. Specifically, spool 64 is placed with arms 68 resting on ledges 73 of opening 58. Wedge 62 is, then, threaded into the assembly by engaging groove 66 with ridge segments 72 and turning the wedge about its axis. The threading continues until the wedge tightens to a set level of torque. Pawl 78 engages the ratchet teeth in groove 66 and holds the wedge in a locked, tightened condition. Cap 76 is preferably placed in recess 74 to prevent fines from becoming impacted in the recess.

To remove the adapter, the cap is first removed to permit a wrench to be fit in recess 74. The wedge is turned to drive the wedge upward so that it can be lifted out of the assembly. The spool 64 is removed from the assembly. Adapter 14 can then be pulled from the lip. If the adapter is stuck in place, a pry tool (not shown) can be inserted into hole 122 and pulled to pry adapter 14 from lip 12.

The above discussion concerns the preferred embodiments of the present invention. Various other embodiments as well as many changes may be made without departing from the spirit and broader aspects of the invention as defined in the claims.

What is claimed is:

1. A wear assembly for attachment to a digging lip of an excavator wherein the lip includes a front digging edge and a through-hole spaced rearward of the digging edge, the wear assembly comprising:
   a boss fixed to each face of the lip;
   a wear member having a front working end and a rear mounting end, the mounting end of the wear member including a pair of bifurcated legs that straddle the lip, the legs and the bosses having cooperating tongue and groove constructions to support the wear member against applied loads during use of the excavator and each said leg including one said opening; and
   a lock received in the openings and the through-hole to engage the mounting end and the lip and hold the wear member to the lip.

2. A wear assembly in accordance with claim 1 wherein each said boss extends rearward of the through-hole.

3. A wear assembly in accordance with claim 2 wherein each said tongue and groove construction includes a slot in the wear member that receives at least a portion of one said boss.

4. A wear assembly in accordance with claim 3 wherein each said boss has lateral shoulders that engage a complementary structure of one said slot to hold the legs to the lip.

5. A wear assembly in accordance with claim 4 wherein each said boss includes an abutment outside of said slot to abut a rear wall of one said leg of the wear member.

6. A wear assembly in accordance with claim 4 wherein the wear member includes a lateral wall that extends between the slot and the opening in each said leg.

7. A wear assembly in accordance with claim 4 wherein each said boss includes a front member provided with the shoulders received in the slot of one said leg of the wear member and a rear member rearward of the slot, and wherein the rear member extends laterally beyond at least part of the front member and is fixed to the shoulders for additional support thereof.

8. A wear assembly in accordance with claim 1 wherein the lock includes a spool and a wedge.

9. A wear assembly in accordance with claim 8 wherein the wedge and spool each includes a thread formation that are coupled together to move the wedge into and out of the openings and the through-hole.

10. A wear assembly in accordance with claim 9 wherein the wedge has a generally conical shape and Includes a helical groove as the thread formation and the thread formation of the spool includes at least one projection that is received into the helical groove.

11. A wear assembly in accordance with claim 1 wherein each said boss includes a stem that extends into the through-hole in the lip.

12. A wear assembly in accordance with claim 11 wherein the stems of the two bosses are fixed to each other in the through-hole of the lip.

13. A wear assembly in accordance with claim 1 wherein at least one of the bosses includes a prying hole outside of the respective slot for receiving a pry tool by which the wear member can be pried from the bosses.

14. A wear assembly in accordance with claim 1 wherein each said boss includes at least one holding surface that is spaced from and faces generally toward the lip, and wherein each said leg of the wear member includes at least one retaining member that fits between the holding surface and the lip and cooperates with the holding surface to resist outward movement of the respective leg relative to the lip.

15. A wear assembly in accordance with claim 14 wherein each said boss is T-shaped and the holding surfaces are formed by rails extending along sidewalls of each said boss.

16. A wear assembly in accordance with claim 14 wherein the holding surfaces are formed by dovetails extending along the sides of each said boss.

17. A wear assembly in accordance with claim 14 wherein the holding surfaces are formed by at least one forwardly projecting flange extending from each said boss, and wherein the retaining member extends rearwardly from the rear wall of each said leg of the adapter.

18. A wear assembly in accordance with claim 1 further comprising an abutment fixed to the lip to abut a rear wall of the wear member.

19. A wear assembly in accordance with claim 18 wherein the abutment is formed as a unitary portion of the boss.

20. A wear assembly in accordance with claim 1 wherein the wear member is an adapter and the forward working end is a nose for mounting a tooth point.

21. A wear assembly in accordance with claim 1 wherein each leg further includes a lateral wall in the slot proximate a rear end of the opening to form a forwardly facing bearing surface to engage the lock.

22. A wear assembly for attachment to a digging lip of an excavator wherein the lip includes a front digging edge, the wear assembly comprising:
   a boss fixed to a face of the lip and having a front main portion and a rear abutment portion;
   a wear member having a front working end and a rear mounting end, the mounting end extending rearward over the face of the lip and having an opening and a rear end wall facing generally away from the digging edge to abut against the abutment portion of the boss, the mounting end and the main portion of the boss having a cooperating tongue and groove construction rearward of the opening to support the wear member against applied loads during use of the excavator; and
   a lock received in the opening to hold the wear member to the lip.

23. A wear assembly in accordance with claim 22 wherein the tongue and groove construction includes a slot in the wear member that receives at least a portion of the boss.

24. A wear assembly in accordance with claim 22 wherein the lip includes an inner face and an outer face, one said boss is fixed to each of the faces, the mounting end includes a pair of bifurcated legs, and each said leg cooperates with one said boss via one said tongue and groove construction.

25. A wear assembly in accordance with claim 24 wherein each said tongue and groove construction includes a slot in each said leg of the wear member to receive at least a portion of the respective boss.

26. A wear assembly in accordance with claim 24 wherein each said leg includes an opening, the lip includes a through-hole that is at least partially aligned with the openings, and the lock is received into the openings and the through-hole.

27. A wear assembly in accordance with claim 26 wherein each said boss further includes a main body extending toward the through-hole, and each said leg of the wear member includes a slot to receive the respective main body to support the rear end of the wear member.

28. A wear assembly in accordance with claim 27 wherein each said boss includes holding surfaces that are spaced from and face toward the lip, and each said leg includes retaining members that fit between the respective holding surfaces and the lip to hold the wear member to the lip.

29. A wear assembly in accordance with claim 28 wherein the holding surfaces are formed by laterally projecting rails of each said main body, and the abutment of each said boss is fixed to the respective rails to provide support therefor.

30. A wear assembly in accordance with claim 27 wherein the mounting end of the wear member includes a lateral wall in each said slot proximate a rear end of the respective opening to form a forwardly facing bearing surface to engage the lock.

31. A bucket lip comprising:
an inner face positioned within an earth-gathering cavity of an excavating bucket;
an outer face positioned opposite the inner face and positioned outside of the earth-gathering cavity of the bucket;
a front digging edge interconnecting the inner and outer faces;
a series of spaced apart through-holes for receiving locks for securing wear members to the lip, each of the through-holes being open in the inner and outer faces and spaced rearward of the front digging edge; and
a plurality of bosses, each to be received into a slot in one of the wear members to provide support therefor, one said boss being fixed to the inner faces and one said boss being fixed to the outer face of the lip rearward of each said through-hole.

32. A bucket lip in accordance with claim 31 wherein each said boss includes holding surfaces spaced from and generally facing the lip to resist movement of the respective wear member outward away from the lip.

33. A bucket lip in accordance with claim 32 wherein each said boss is T-shaped and the holding surfaces are formed by rails extending along sidewalls of each said boss.

34. A bucket lip in accordance with claim 32 wherein the holding surfaces are formed by dovetails extending along the sidewalls of each said boss.

35. A bucket lip in accordance with claim 32 wherein the holding surfaces are formed by a forwardly projecting flange extending from each said boss.

36. A bucket lip in accordance with claim 32 wherein each said boss includes an abutment outside of said slot to abut a rear wall of the respective wear member.

37. A bucket lip in accordance with claim 31 wherein each said boss is formed as a unitary part of the lip.

38. A bucket lip in accordance with claim 31 wherein each said boss is welded to the lip.

39. A bucket lip in accordance with claim 31 wherein each said boss includes a stem that extends into the through-hole in the lip.

40. A bucket lip in accordance with claim 39 wherein the stems of the two bosses are fixed to each other in the through-hole of the lip.

41. A bucket lip in accordance with claim 31 wherein at least one of the bosses includes a prying hole outside of the respective slot for receiving a pry tool by which the wear member can be pried from the bosses.

42. A bucket lip in accordance with claim 31 further comprising an abutment to abut a rear wall of each said wear member, wherein the abutment is wider than at least a front part of the boss to be received into the slot in the respective wear member.

43. A bucket lip in accordance with claim 42 wherein the abutment is formed as a unitary portion of the boss.

44. A wear member for attachment along the lip of a bucket, the wear member comprising:
a front working end; and
a pair of rearwardly extending bifurcated legs, each said leg including an inner surface to face the lip, a rear wall, a slot that opens in the inner face and the rear wall to receive a boss on the lip, an opening to receive a lock, and a lateral wall in the slot, proximate a rear end of the opening, forming a bearing surface to engage a rear surface of the lock received through the opening.

45. A wear member in accordance with claim 44 wherein each said slot has a recessed wall spaced from and facing the inner surface of the respective leg, and a narrowed portion positioned between the recessed wall and the inner surface to define retaining portions that cooperate with complementary structures on a boss fixed to the lip to hold the respective leg to the lip.

46. A wear member in accordance with claim 45 wherein each said slot has a T-shaped configuration.

47. A wear member in accordance with claim 45 where each said slot has a generally dovetail shaped configuration.

48. A wear member in accordance with claim 44 further including retaining members, of lesser thickness than the legs, which extend rearward of the legs to cooperate with a boss fixed to the leg to resist outward movement of each said leg away from the lip.

49. A wear member in accordance with claim 44 wherein each said slot has generally flat sidewalls that extend generally perpendicular to the lip.

50. A wear member in accordance with claim 44 wherein the wear member is an adapter and forward working end is a nose for mounting a tooth point.

51. A wear member for attachment to a lip of an excavator, the lip having a boss, the wear member comprising:
a front working end;
a pair of bifurcated legs that straddle the lip, each said leg including an inner wall adapted to face the lip, an outer wall spaced from the lip and defining a wear surface, and a rear wall;
an opening extending through each said leg for receiving a lock for holding the wear member to the lip; and
a longitudinal slot in at least one leg for receiving the boss, the slot being open in the inner wall and the rear wall of the respective leg and having a narrow portion defined by inwardly extending rails along the inner wall and an enlarged portion between the rails and the outer wall, the rails extending between the rear wall and the opening to engage and cooperate with rails on the boss to hold the leg to the lip.

52. A wear member in accordance with claim 51 wherein the rails extend only between the rear wall and the opening.

53. A wear member in accordance with claim 51 wherein the slot in each said leg has a generally uniform construction.

54. A wear member in accordance with claim 51 further including a lateral wall in the slot, proximate a rear end of the opening, defining a forwardly facing bearing surface to engage the lock received through the opening.

55. A wear member for attachment to a lip of an excavator, the lip having a boss, the wear member comprising:
a front working end;

a leg that extends over the lip, the leg including an inner wall adapted to face the lip, an outer wall spaced from the lip and defining a wear surface;

an opening extending through the leg for receiving a lock for holding the wear member to the lip;

a longitudinal slot for receiving the boss, the slot being open in the inner wall and the rear wall and having a narrow portion defined by inwardly extending rails along the inner wall and an enlarged portion between the rails and the outer wall, the rails extending between the rear wail and the opening to engage and cooperate with rails on the boss to hold the leg to the lip; and a lateral wail in the slot proximate a rear end of the opening having a bearing face for engaging a lock to hold the wear member to the lip, the bearing face being generally perpendicular to a longitudinal axis of the slot across its entire length.

56. A wear member in accordance with claim 55 further including a second leg extending over the lip opposite said first mentioned leg, and a bearing wall at a rear end of the leg to abut against an abutment portion of the boss to prevent rearward movement of the leg during use.

57. A wear member in accordance with claim 55 wherein the rails extend only between the rear wall and the opening.

58. A wear member in accordance with claim 55 wherein two of said legs are provided to straddle the lip.

59. A boss to be fixed to a lip of an excavating bucket for supporting a wear member attached to the lip, the boss comprising:

a main body to be received in a slot of the wear member, the main body having an inner surface to set against a face of the lip and a pair of opposite sidewalls; and a stem extending generally outward from the inner surface to fit within a hole in the lip.

60. A boss in accordance with claim 59 further including a rearward member that includes at least one forwardly facing bearing surface to abut a rear wall of the wear member.

61. A boss in accordance with claim 59 further including at least one holding surface that is spaced from and faces generally toward the lip to engage the wear member and resist outward movement of the wear member relative to the lip.

62. A boss in accordance with claim 61 wherein the main body is T-shaped and the holding surfaces are formed by rails extending along the sidewalls.

63. A boss in accordance with claim 61 wherein the holding surfaces are formed by dovetails extending along the sidewalls.

64. A boss in accordance with claim 61 wherein the holding surfaces are formed by a forwardly projecting flange extending from the boss.

65. A boss in accordance with claim 59 further comprising including a prying hole to be outside of the slot for receiving a pry tool by which the wear member can be pried from the boss.

66. A boss in accordance with claim 59 with body portion that is longitudinally tapered, increasing in width toward the rear.

67. A method of installing a wear member on a lip of an excavator wherein the lip has a through-hole and a boss on each side of the lip, the method comprising:

placing a wear member including a pair of rearwardly extending legs, each of the legs having a longitudinal slot and a transverse opening, on a lip such that the legs straddle the lip;

moving the wear member rearward relative to the lip such that each boss moves axially into one of the slots until reaching a mounting position where the opening in the wear member is generally aligned with the through-hole in the lip; and placing a lock into the opening and the through-hole forward of the slot and boss to hold the wear member to the lip.

68. A method in accordance with claim 67 further including operating the lock to increase the dimension of the lock in a longitudinal direction such that the wear member is pressed rearward relative to the lip.

69. A method in accordance with claim 68 wherein operating the lock includes moving a wedge component of the lock transversely through the opening and through-hole.

70. A method in accordance with claim 69 wherein operating the lock includes moving the wedge component relative to a spool that is stationary in the transverse direction.

71. A method in accordance with claim 69 wherein operating the lock includes turning the wedge to thread the wedge into the opening and through-hole.

72. A wear member in accordance with claim 44 wherein each said rear wall is a bearing surface to abut an abutment fixed to the lip to resist rearward deflection of the respective leg.

73. A wear member in accordance with claim 51 wherein each said rear wall is a bearing surface to abut an abutment fixed to the lip to resist rearward deflection of the respective leg.

74. A wear member for attachment to a lip of an excavator, the lip having a pair of opposite faces, a digging edge extending between the two faces, and an abutment fixed to each face, the wear member comprising:

a front working end;

a pair of bifurcated legs that straddle the lip, each said leg including an inner wall adapted to face the lip, an outer wall spaced from the lip and defining a wear surface, and a rear bearing wall to abut a front face of one of the abutments and thereby resist rearward deflection of the leg; and an opening in at least one of the legs forward of the bearing wall for the same said one leg for receiving a lock for holding the wear member to the lip.

75. A wear member in accordance with claim 74 further including a longitudinal slot in at least one leg for receiving a boss fixed to the lip, the slot being open in the inner wall and the rear wall of the respective leg.

76. A wear member in accordance with claim 75 wherein the slot includes a narrow portion defined by inwardly extending rails along the inner wall and an enlarged portion between the rails and the outer wall, the rails extending between the rear wall and the opening to engage and cooperate with rails on the boss to hold the leg to the lip.

77. A wear member in accordance with claim 75 wherein each leg includes one said slot for receiving a boss fixed to the lip.

78. A wear assembly for attachment to a lip of an excavator, the lip having a pair of opposite faces and a digging edge extending between the two faces, the wear assembly comprising:

a boss fixed to each face of the lip, each said boss including an abutment; and a wear member including:

a front working end;

a pair of bifurcated legs that straddle the lip, each said leg including an inner wall adapted to face the lip, an outer wall spaced from the lip and defining a wear surface, and a bearing wall to abut a front face of one of the abutments and thereby resist rearward deflection of the leg; and an opening extending through at least one of the legs forward of the bearing wall for the same said one leg for receiving a lock for holding the wear member to the lip; and a lock received in the opening for holding the wear member to the lip.

79. A wear assembly in accordance with claim 78 further including a longitudinal slot in at least one leg for receiving the boss, the slot being open in the inner wall and the rear wall of the respective leg.

80. A wear assembly in accordance with claim 79 wherein the slot includes a narrow portion defined by inwardly extending rails along the inner wall and an enlarged portion between the rails and the outer wall, the rails extending between the rear wall and the opening to engage and cooperate with rails on the boss to hold the leg to the lip.

81. A wear assembly in accordance with claim 79 wherein each leg includes one said slot for receiving a boss fixed to the lip.

* * * * *

UNITED STATES PATENT AND TRADEMARK OFFICE
CERTIFICATE OF CORRECTION

| | |
|---|---|
| PATENT NO. | : 6,986,216 B2 |
| APPLICATION NO. | : 10/425606 |
| DATED | : January 17, 2006 |
| INVENTOR(S) | : Robert K. Emrich et al. |

It is certified that error appears in the above-identified patent and that said Letters Patent is hereby corrected as shown below:

In Column 9, Line 58, "Includes" should be changed to --includes--.

In Column 13, Line 11, "wail" should be changed to --wall--; Line 13, "wail" should be changed to --wall--; and Line 54, delete "comprising".

Signed and Sealed this

Twenty-sixth Day of June, 2007

JON W. DUDAS
*Director of the United States Patent and Trademark Office*